(12) United States Patent
Mosley

(10) Patent No.: US 6,770,969 B2
(45) Date of Patent: Aug. 3, 2004

(54) HIGH PERFORMANCE CAPACITOR

(75) Inventor: Larry Eugene Mosley, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/075,659

(22) Filed: Feb. 13, 2002

(65) Prior Publication Data

US 2002/0071258 A1 Jun. 13, 2002

Related U.S. Application Data

(62) Division of application No. 09/473,315, filed on Dec. 28, 1999.

(51) Int. Cl.[7] .......................... H01L 23/62; H05K 7/06; H01G 4/228
(52) U.S. Cl. ...................... 257/724; 257/691; 257/777; 361/306.2; 361/306.3; 361/782; 361/783
(58) Field of Search ............................... 361/734, 738, 361/760, 763, 767, 768, 782, 783, 792–795, 306.1, 306.2, 306.3, 803; 257/686, 691, 700, 723, 724, 777; 428/210

(56) References Cited

U.S. PATENT DOCUMENTS

| | | | |
|---|---|---|---|
| 4,328,530 A | 5/1982 | Bajorek et al. ............. 361/308 |
| 4,831,494 A | 5/1989 | Arnold et al. .............. 361/306 |
| 5,093,757 A | 3/1992 | Kawakita et al. ........... 361/321 |
| 5,107,394 A | 4/1992 | Naito et al. ................. 361/309 |
| 5,117,326 A | 5/1992 | Sano et al. ................. 361/321 |
| 5,159,524 A | 10/1992 | Hasegawa et al. .......... 361/271 |
| 5,369,545 A | 11/1994 | Bhattacharyya et al. . 361/306.2 |
| 5,471,363 A | 11/1995 | Mihara ....................... 361/305 |
| 5,512,353 A | 4/1996 | Yokotani et al. ............ 428/210 |
| 5,530,288 A * | 6/1996 | Stone .......................... 257/700 |
| 5,679,980 A | 10/1997 | Summerfelt ................. 257/751 |
| 5,696,018 A | 12/1997 | Summerfelt et al. .......... 437/60 |
| 5,729,054 A | 3/1998 | Summerfelt et al. ........ 257/751 |
| 5,745,335 A | 4/1998 | Watt ........................... 361/313 |
| 5,781,255 A * | 7/1998 | Yamamoto et al. ........... 349/46 |
| 5,781,404 A | 7/1998 | Summerfelt et al. ..... 361/321.5 |
| 5,793,057 A | 8/1998 | Summerfelt ................. 257/55 |
| 5,811,851 A | 9/1998 | Nishioka et al. ............ 257/310 |
| 5,910,881 A | 6/1999 | Ueno .......................... 361/313 |
| 5,942,063 A | 8/1999 | Mori ....................... 156/89.16 |
| 5,972,053 A | 10/1999 | Hoffarth et al. ........... 29/25.03 |

(List continued on next page.)

FOREIGN PATENT DOCUMENTS

EP 0917165 A2 5/1999 ............ H01G/4/30

OTHER PUBLICATIONS

"Capacitor for Multichip Modules", *IBM Technical Disclosure Bulletin*, vol. 20, Issue 8, (Jan. 1, 1978), 3117–3118.

Primary Examiner—John B. Vigushin
(74) Attorney, Agent, or Firm—Schwegman, Lundberg, Woessner & Kluth, P.A.

(57) ABSTRACT

A capacitor includes a controlled collapse chip connection system coupled by vias to a plurality of conductive layers embedded in a dielectric. The capacitor and a die can each be mounted on opposite surfaces of a substrate using a controlled collapse chip connection. The controlled collapse chip connection provides a large number of leads for coupling to the conductive layers of the capacitor. The large number of leads reduce the inductance in the connection. For a thin substrate, the length of the conductive material connecting the capacitor to the die is short, and the inductance and resistance of the conductive material is low. A system comprising two dies can be fabricated in a small volume using a plurality of substrates and a single controlled collapse chip connection compatible capacitor for decoupling the two dies.

11 Claims, 4 Drawing Sheets

U.S. PATENT DOCUMENTS

| | | | |
|---|---|---|---|
| 5,973,910 A | 10/1999 | Gardner | 361/313 |
| 6,023,407 A | 2/2000 | Farooq et al. | 361/303 |
| 6,034,864 A | 3/2000 | Naito et al. | 361/306.1 |
| 6,037,044 A * | 3/2000 | Giri et al. | 428/209 |
| 6,072,690 A | 6/2000 | Farooq et al. | 361/321.2 |
| 6,101,693 A | 8/2000 | Kim et al. | 29/25.42 |
| 6,178,093 B1 * | 1/2001 | Bhatt et al. | 361/795 |
| 6,191,479 B1 | 2/2001 | Herrell et al. | 257/724 |
| 6,225,678 B1 | 5/2001 | Yach et al. | 357/532 |
| 6,228,682 B1 * | 5/2001 | Farooq et al. | 438/110 |
| 6,272,020 B1 * | 8/2001 | Tosaki et al. | 361/763 |
| 6,274,937 B1 * | 8/2001 | Ahn et al. | 257/777 |
| 6,351,369 B1 | 2/2002 | Kuroda et al. | 361/306.3 |
| 6,366,443 B1 | 4/2002 | Devoe et al. | 361/313 |
| 6,370,010 B1 | 4/2002 | Kuroda et al. | 361/306.1 |

\* cited by examiner

HIGH PERFORMANCE CAPACITOR

This application is a divisional of application U.S. Ser. No. 09/473,315, filed on Dec. 28, 1999.

FIELD

The present invention relates to capacitors, and more particularly to capacitors having a high capacitance, low inductance, and low resistance.

BACKGROUND

Voltage levels on a die exhibit a droop when there is a sudden increase in demand for power on the die. This voltage droop on the die increases the switching time of the transistors on the die, which degrades the performance of the system fabricated on the die. To decrease the voltage droop during power surges, discrete decoupling capacitors are mounted adjacent to the die and connected to the conductors that provide power to the die. For a processor die, the die is mounted on a substrate, and a ring of capacitors, usually ten to fifteen two microfarad capacitors, are mounted on the substrate along the periphery of the die. These capacitors are coupled to the power supply connections at the die through lands formed on the substrate. Problems with this decoupling solution and the capacitors used to implement this solution are long standing, well known, and interrelated.

One problem with this decoupling solution is that a large number of external decoupling capacitors are required to control the voltage droop on a die. Mounting a large number of external decoupling capacitors wastes substrate real estate and reduces the die packing density on the substrate. In addition, surface area on the substrate is reserved for handling and mounting the discrete capacitors, and this reserved area is unavailable for mounting other information processing dies.

A second problem with this decoupling solution relates to the long leads needed to connect the capacitors to the power supply connections sites on the die. Power supply connection sites are usually scattered across a die. In general, it is desirable to run short leads from a power supply plane in a substrate to the power supply sites on the die. Unfortunately, with the decoupling capacitors located near the periphery of the die, long leads must be run to the power supply connection sites scattered across the die. The long leads increase the inductance and resistance of the decoupling capacitors, which tends to increase the voltage droop in response to a power surge. The long leads used to connect a die to a decoupling capacitor limit the high frequency performance of the decoupling capacitor.

A third problem is that capacitors having a large capacitance value typically have a large inherent inductance and resistance. This inherent inductance and resistance causes a large voltage droop at the die.

One solution to these problems is to fabricate a large number of capacitors on the die for decoupling the power supply connections on the die. Unfortunately, capacitors already take up a large amount of real estate on a die for a typical integrated circuit, and fabricating more capacitors on a die reduces the area available for information processing circuits.

For these and other reasons there is a need for the present invention.

SUMMARY

A capacitor comprises a plurality of conductive layers embedded in a dielectric. A plurality of vias couple at least two of the plurality of conductive layers to a plurality of connection sites.

DETAILED DESCRIPTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The present invention provides a high capacitance, low profile capacitor having a low inductance and a low resistance and a system for mounting the capacitor close to a die. To fabricate a high capacitance low profile capacitor, a plurality of thin screen printed dielectric sheets are stacked to form the capacitor. To reduce the inductance and resistance in the capacitor leads, a large number of vias are coupled to the conductive layers printed on the stacked dielectric sheets. Finally, to control the length of the leads that couple the capacitor to a die, the vias at the surface of the capacitor are fabricated to couple to a substrate using controlled collapse chip connection technology. Alternatively, to control the length of the leads that couple the capacitor to a die, the capacitor is mounted on a laminated layer and vias are laser drilled and plated to provide the electrical connection to the capacitor.

Figure 1A:
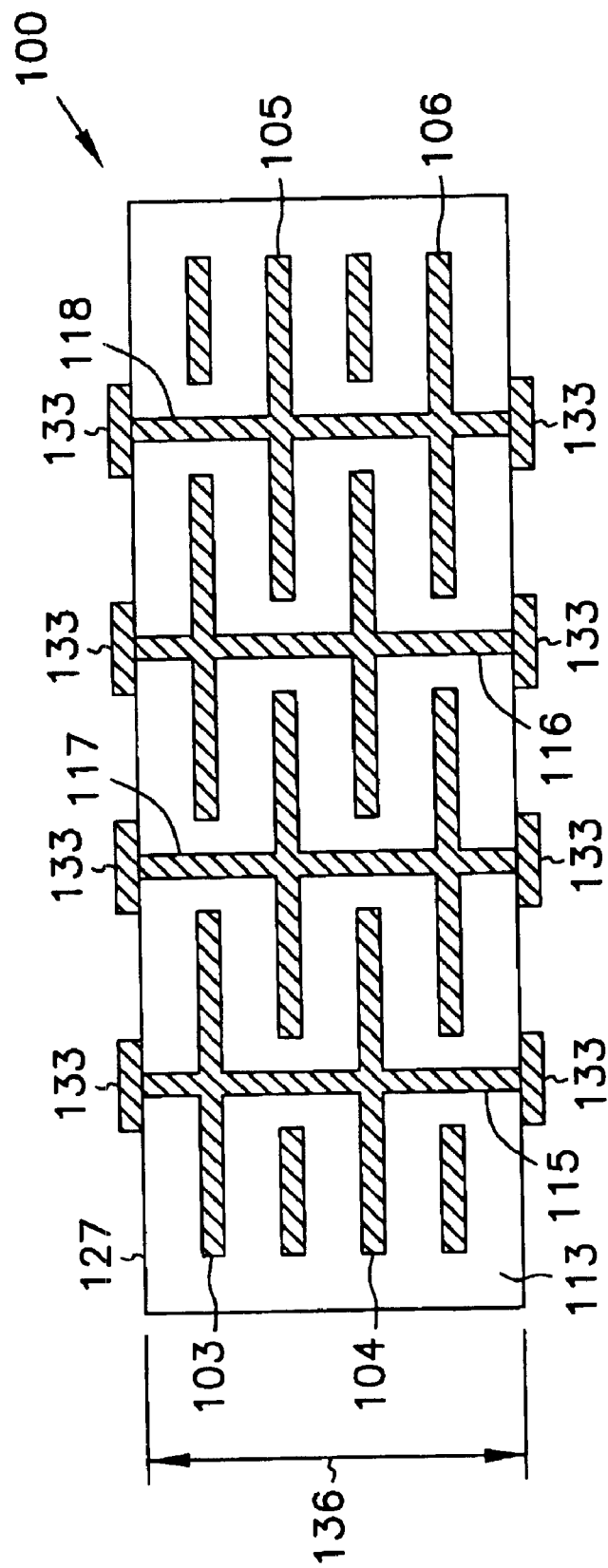
FIG. 1A is an illustration of a cross-sectional side view of some embodiments of a capacitor of the present invention.

FIG. 1A is an illustration of a cross-sectional side view of some embodiments of capacitor 100 of the present invention. Capacitor 100, in one embodiment, is a multilayered capacitor including a first plurality of conductive layers 103 and 104 interlaced with a second plurality of conductive layers 105 and 106. Increasing the number of conductive layers in capacitor 100 increases the capacitance. In one embodiment, capacitor 100 has about 50 conductive layers and a capacitance of between about 20 microfarads and 30 about microfarads. Conductive layers 103–106 are fabricated from a conductive material. For example, in one embodiment, conductive layers 103–106 are fabricated from platinum. Alternatively, conductive layers 103–106 are fabricated from palladium. In still another alternate embodiment, conductive layers 103–106 are fabricated from tungsten. Conductive layers 103–106 are embedded in dielectric 113. Conductive layers 103 and 104 are coupled together by vias 115 and 116, and conductive layers 105 and 106 are coupled together by vias 117 and 118. In one embodiment, vias 115–118 are plated through holes that terminate on outer surfaces 127 and 130 in a plurality of connection sites, such as controlled collapse chip connection (C4) sites 133. A large number of C4 sites decreases the resistance and the inductance of capacitor 100, which improves the performance of capacitor 100 as a decoupling capacitor. In one embodiment, capacitor 100 has about 4000 C4 sites. Controlled collapse chip connection sites 133 are not limited to being fabricated on a single surface. In one embodiment, C4 sites 133 are fabricated on outer surfaces 127 and 130. Providing C4 sites on a plurality of surfaces increases the number of electronic dies or devices that can be coupled to capacitor 100. Coupling structures for capacitor 100 are not limited to C4 structures. In one embodiment, vias 115–118 terminate on outer surfaces 127 and 130 in pads suitable for coupling to a substrate, an electronic device, or a die.

In one embodiment, capacitor 100 has a thickness 136 of between about 0.5 millimeter and about 1 millimeter, a top surface area of about 1 cm$^2$, and a capacitance of between about 20 microfarads and about 30 microfarads. A capacitance of between about 20 microfarads and about 30 microfarads makes capacitor 100 suitable for use in decoupling high frequencies that appear on power supply lines in complex digital systems, such as microprocessors. A thickness 136 of between about 0.5 millimeter and about 1 millimeter makes capacitor 100 suitable for packaging with communication devices, such as cell phones, that are packaged in a small volume.

Figure 1B:
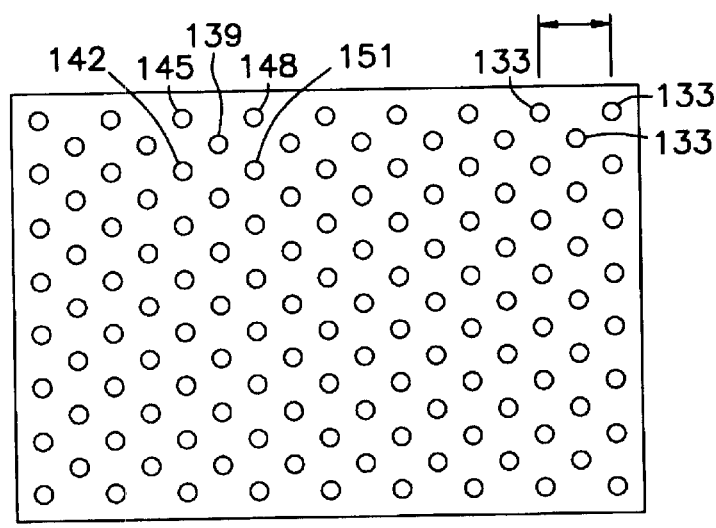
FIG. 1B is an illustration of a top view of a capacitor showing one embodiment of a controlled collapse chip connection pattern.

FIG. 1B is an illustration of a top view of capacitor 100 of FIG. 1A showing one embodiment of a pattern of controlled collapse chip connection sites. In one embodiment, the controlled collapse connection sites 133 have a pitch of between about 100 microns and about 500 microns. A pitch of between about 100 and about 500 microns reduces the inductance and resistance in the connections. In one embodiment, C4 site 139 is coupled to a high voltage level, and C4 sites 142, 145, 148, and 151 are coupled to a low voltage level. Each high voltage level C4 site is surrounded by four low voltage level sites. This pattern of power distribution in the C4 sites reduces the inductance and resistance in capacitor 100, which improves the high frequency performance of capacitor 100.

For one embodiment of a method for fabricating capacitor 100, a plurality of dielectric sheets are screen printed with a tungsten paste or other suitable suspension of tungsten and stacked. The dielectric sheets are fabricated from barium titanate and have a thickness of between about 5 microns and about 7 microns. The tungsten paste forms the conductive layers 103–106 of capacitor 100. To add strength to the stack, slightly thicker dielectric sheets are used to form the top and bottom layers of the stack. Via holes are formed in the stack to couple conductive layers 103–106 to controlled collapse chip connection sites 133. Processes suitable for use in forming the via holes include mechanical drilling, laser drilling, and etching. The via holes are filled with a metal slurry, which, in one embodiment, is formed from tungsten. To further increase the rigidity of the stack, the stack is co-fired at about 1500 degrees centigrade and diced into individual capacitors.

Figure 2:
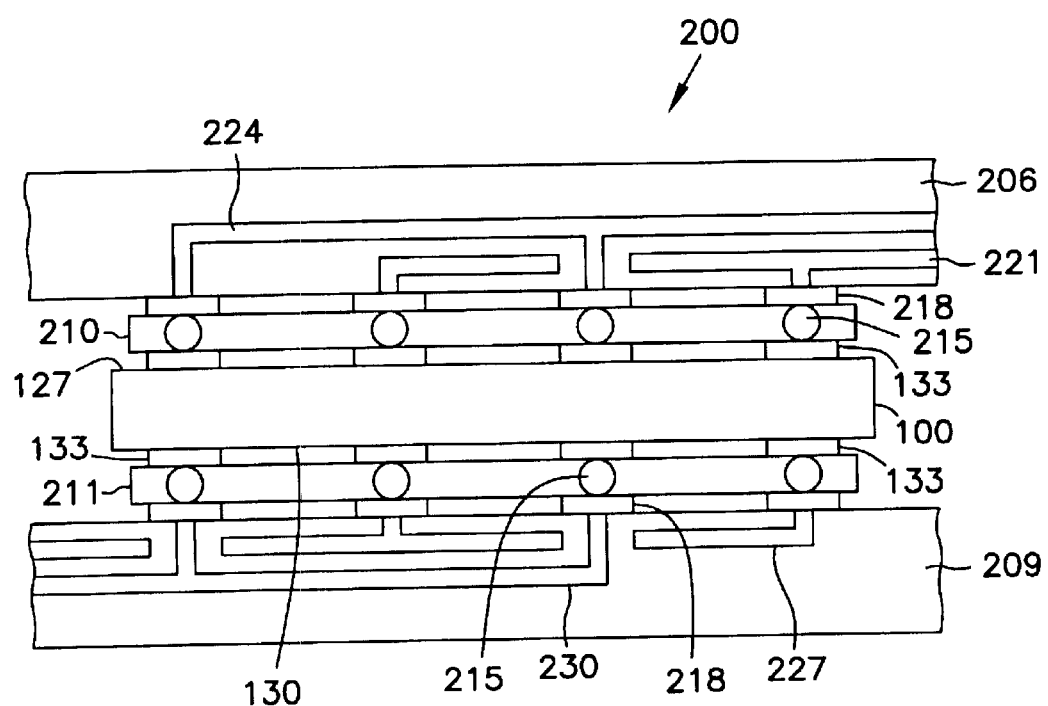
FIG. 2 is an illustration of a cross-sectional view of some embodiments of a system including a capacitor coupled to a plurality of substrates.

FIG. 2 is an illustration of a cross-sectional view of some embodiments of system 200 for coupling capacitor 100 to substrates 206 and 209. Substrates 206 and 209, in one embodiment, are fabricated from a ceramic. Alternatively, substrate 206 is a die, such as a silicon die, and substrate 209 is fabricated from a ceramic. In one embodiment, capacitor 100 is coupled to substrates 206 and 209 through controlled collapse chip connections (C4) 210 and 211. C4 connection sites 133 on the surfaces 127 and 130 of capacitor 100 are coupled through solder balls 215 to connection sites 218 and substrates 206 and 209. First and second metallization layers 221 and 224 in substrate 206 and first and second metallization layers 227 and 230 in substrate 209 can be coupled to devices mounted on substrates 206 and 209, thereby coupling capacitor 100 to the devices. The capability to couple capacitor 100 to a plurality of substrates permits increased packing densities for complex electronic devices fabricated in connection with substrates 206 and 209. For example, several microprocessors can be packaged on substrates 206 and 209, and the power supply connections for the several microprocessors can be decoupled by capacitor 100. By reducing the number of discrete decoupling capacitor packages that are required to decouple the several microprocessors, the reliability of the system 200 is increased.

Figure 3:
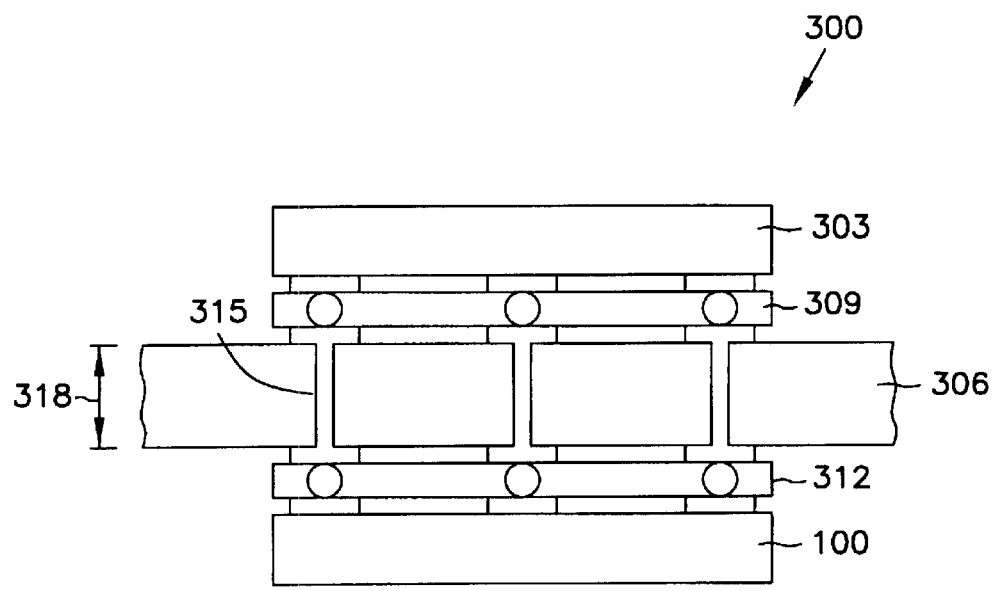
FIG. 3 is an illustration of a cross-sectional view of one embodiment of a system including a die and a capacitor coupled to a substrate.

FIG. 3 is an illustration of a cross-sectional view of one embodiment of system 300 for coupling die 303 to capacitor 100 through common substrate 306. In one embodiment, die 303 includes an electronic device, such as a processor, a communication system, or an application specific integrated circuit. Die 303 is coupled to a first surface of substrate 306 by controlled collapse chip connection (C4) 309. Capacitor 100 is coupled to a second surface of substrate 306 by controlled collapse chip connection 312. Conductive vias 315 in substrate 306 couple capacitor 100 to die 303. In one embodiment, substrate 306 is fabricated from a ceramic material. Alternatively, substrate 306 is fabricated from an organic material. Preferably, substrate 306 is thin, which permits a short coupling distance between capacitor 100 and die 303. In one embodiment, substrate 306 has a thickness 318 of less than about 1 millimeter. A short coupling distance reduces the inductance and resistance in the circuit in which capacitor 100 is connected.

Figure 4:
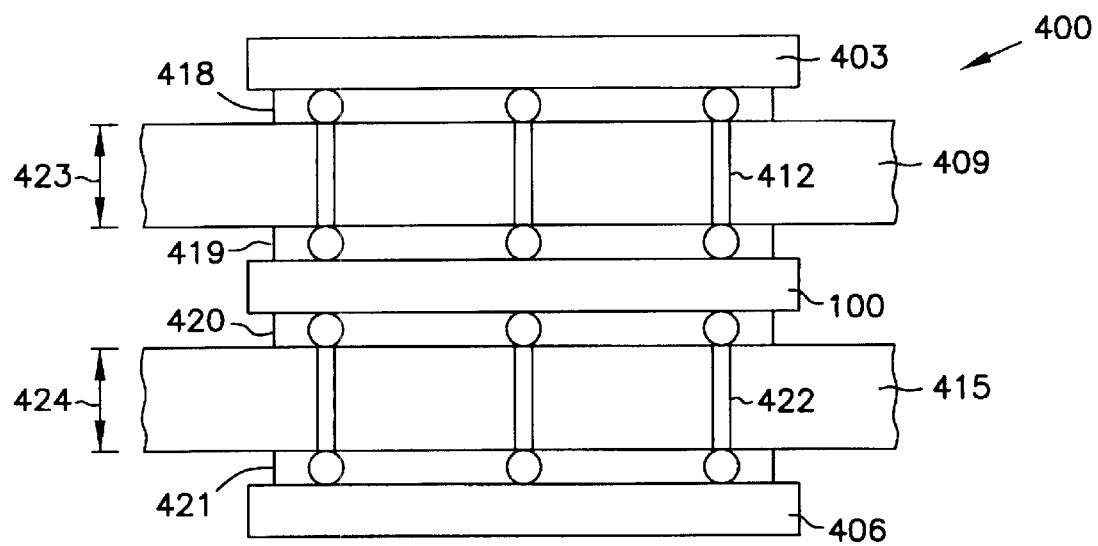
FIG. 4 is an illustration of a cross-sectional view of some embodiments of a system including capacitor coupled to a plurality of electronic dies.

FIG. 4 is an illustration of a cross-sectional view of some embodiments of system 400 including capacitor 100 coupled to electronic dies 403 and 406. Substrate 409 provides a foundation for mounting die 403 and capacitor 100. In addition, substrate 409 couples die 403 to capacitor 100 through vias 412. Similarly, substrate 415 provides a foundation for mounting die 406 and capacitor 100, and couples die 406 to capacitor 100 through vias 422. Connections, such as controlled collapse chip connections 418–421 couple die 403, die 406 and capacitor 100 to substrates 409 and 415. For substrate 409 having a thickness 423 of less than about 1 millimeter and substrate 415 having a thickness 424 of less than about 1 millimeter, the resistance and inductance of capacitor 100 and vias 412 and 422 is low. So, decoupling power supply connections at die 403 and 406 is improved by packaging dies 403, 406 and capacitor 100 as described above.

Figure 5:
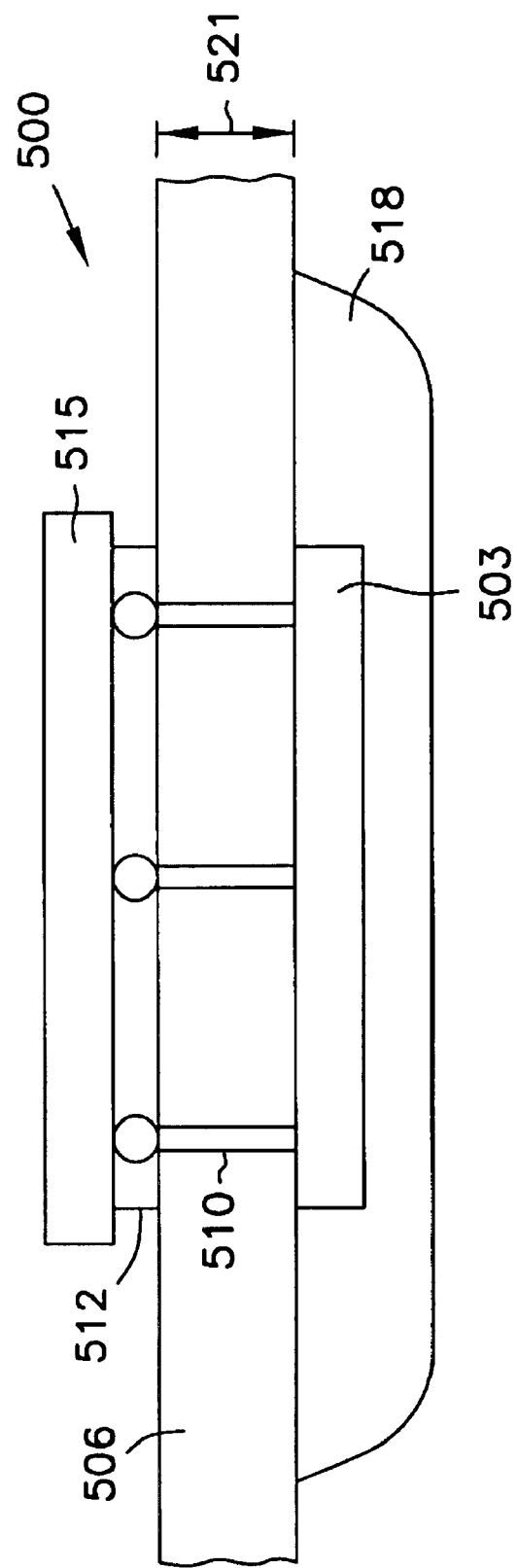
FIG. 5 is an illustration of a cross-sectional view of some embodiments of a system including a capacitor coupled to a dielectric substrate and electrically coupled to a die.

FIG. 5 is an illustration of a cross-sectional view of some embodiments of a system 500 including capacitor 503 coupled to substrate 506 and electrically coupled by vias 510 and controlled collapse chip connection 512 to die 515. Capacitor 503 is coupled to power supply connections on die 515 to decouple the power supply connections at the die. Capacitor 503 is protected from the environment by molding 518. In one embodiment, substrate 506 is formed from a low K dielectric and has a thickness 521 of between about 0.05 millimeters and about 0.1 millimeters. A dielectric thickness of between about 0.05 millimeter and 0.1 millimeter allows system 500 to be fabricated with shorter capacitor leads than the capacitor leads in system 400. As described above, a system having short leads between capacitor 503 and die 515 results in a capacitor having a low inductance and a low resistance, which improves the performance of the decoupling circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A system comprising:
   a first die;
   a second die; and
   a capacitor including a plurality of plated through holes coupling at least four conductive layers embedded in a dialectric to a plurality of connection sites and having a first surface having a controlled collapse chip connection coupled to the first die and a second surface having a controlled collapse chip connection coupled to the second die.

2. The system of claim 1, wherein the at least four conductive layers comprise platinum.

3. The system of claim 2, wherein the first die comprises silicon.

4. A system comprising:
   a die including an electronic system;
   a capacitor located less than about 0.1 millimeter from the die and coupled to the die, wherein the capacitor is capable of decoupling a power supply connection at the die without additional capacitors located external to the die, and wherein the capacitor comprises palladium; and
   a dialectric layer located between the capacitor and the die.

5. The system of claim 4, wherein the capacitor comprises barium titanate.

6. The system of claim 5, wherein the barium titanate is formed from sheets having a thickness of between about five and about seven microns.

7. A system comprising:
   a first die;
   a second die; and
   a capacitor having a first surface having a controlled collapse chip connection coupled to the first die and a second surface having a controlled collapse chip connection coupled to the second die, wherein the first die includes a processor and the second die includes a communication system, and wherein the capacitor comprises a plurality of dielectric sheets having at least two different thicknesses.

8. The system of claim 7, wherein the first die and the second die comprise silicon.

9. A system comprising:
   a substrate having a first surface and a second surface;
   a die coupled to the first surface; and
   a capacitor having a plurality of pleated through holes coupled to a plurality of conductive layers in the capacitor, the capacitor is coupled to the second surface by a controlled collapse chip connection and the capacitor is electrically coupled to the die through the substrate, and wherein the capacitor includes a high voltage site surrounded by four low voltage sites.

10. The system of claim 9, wherein each of the conductive layers comprises palladium.

11. A system comprising:
    a processor requiring at least 5 watts of power to be operable; and
    a single multilayered single package capacitor coupled to the processor and capable of decoupling a power supply from the processor, wherein the single multilayered single package capacitor comprises barium titanate and platinum.

* * * * *